MULTIPLE ELEMENT PRINTED CIRCUIT COMPONENT

Filed Dec. 7, 1954

INVENTOR.
CHARLES WELLARD

BY

Donald S. Cohen
ATTORNEY

United States Patent Office 2,899,608

Patented Aug. 11, 1959

2,899,608

MULTIPLE ELEMENT PRINTED CIRCUIT COMPONENT

Charles Wellard, Bridgeport, Pa., assignor to International Resistance Company, Philadelphia, Pa.

Application December 7, 1954, Serial No. 473,615

3 Claims. (Cl. 317—101)

This invention relates to a multiple element printed circuit component and more particularly to a printed circuit component made up of a number of sub-assemblies connected together to form a single unit.

Heretofore, printed circuit components have been made by coating the surface of a single plate of insulating material with a desired pattern of conductive and resistance materials to obtain a desired circuitry of electrical components. The plates used are usually of a ceramic material which has been compressed to the desired shape and fired at a high temperature. In using a single plate many problems have been encountered such as obtaining both high and low valued capacitors where the plate has a single dielectric constant. One method of making capacitors of different values on the same plate is to vary the area of conductive coatings but the area of a low valued capacitor must then be so small that it is difficult to control the tolerance for a small change in area causes a large change in capacitance. Another method of making low valued capacitors on such plates has been to use the stray capacitance between two very close strips of conductive material on the same surface of the plate. However, this method is also hard to control since a slight change in the distance between the strips causes a large change in capacitance and the breakdown voltage between the strips is very low.

The recent trend toward having many components in a single printed circuit unit creates another problem for the more components printed on a single plate the more difficult it is to obtain all the components within the desired tolerance. Usually the component circuitry patterns are printed on the plate through a stencil type mask and since different types and kinds of components are made with different materails, separate masks are necessary for each. Also, resistor components sometimes require different materials for different values. Because the materials used are in paste or ink form, each must be dried by heating before another material can be printed on the plate. Some of the materials change in electrical properties when heated and great care must be exercised lest there be under or overheating. Yet the materials first printed on the plate are heated a number of times before all the components are printed on the plate; consequently changes in value are frequent and hard to control. Thus the more components printed on the single plate the less chance there is that all the components will finally come out within the desired tolerance and the more difficult it becomes to obtain a high production yield of finished units. Also obviously the greater the number of components to be printed on the plate the larger the plate must be. The large size ceramic plates are made with difficulty and hence are very expensive. In fact a single plate of area A is considerably more expensive than two plates each of area ½A. Accordingly due to low production yield and the high cost of large ceramic plates printed circuit components having a large number of components are very expensive to manufacture.

A further problem in manufacturing printed circuit components arises where it is desirable to electrically connect components each printed on opposite sides of the ceramic plate. Heretofore this has been done by extending a conductive coating across an edge of the plate. This must be done by hand and is therefore time consuming adding to the expense of the unit.

It is therefore an object of this invention to provide a multiple element printed component in which the above mentioned difficulties, as well as others, are successfully overcome. It is another object to provide a multiple element printed circuit component in which each capacitor is printed on a material having the proper dielectric constant for the value of the capacitor. It is still another object to provide a printed circuit component including a large number of components printed thereon which can be easily produced with a high yield of completed units. A further object is to provide a printed circuit component in which any component printed thereon can be easily connected to any other component on either side of the ceramic plate. Other objects of the invention will in part be obvious and will in part appear hereinafter.

The invention accordingly comprises the features of construction, combinations of elements, and arrangement of parts, which will be exemplified in the constructions hereinafter set forth, and the scope of the invention will be indicated in the claims.

For a fuller understanding of the nature and objects of the invention, reference should be had to the following detailed description taken in connection with the accompanying drawing in which.

In general, the printed circuit component comprises a plurality of plates of ceramic material, each having coatings of conductive and resistance materials printed thereon in patterns to form electrical components such as capacitors and resistors. Each plate is formed from a material having the proper dielectric constant and temperature coefficient for the value of the capacitors printed thereon. The plates are connected together in edgewise abutting relation by U-shape clips which not only mechanically join the plates into a single unit but can also electrically connect the patterns on the plates to provide a desired single electrical unit.

Figure 1:
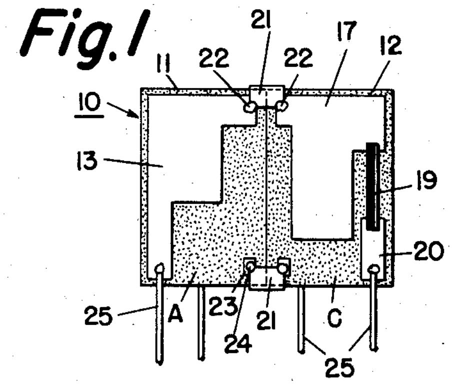
Figure 1 is a plan view of one side of a printed circuit component made in accordance with this invention.
Figure 2:
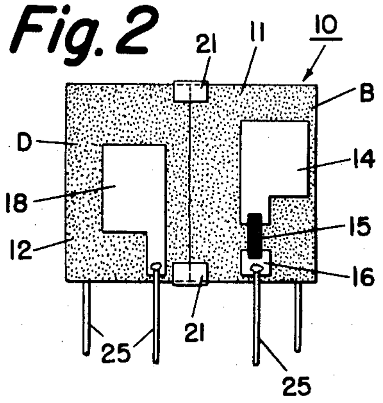
Figure 2 is a plan view of the other side of the component shown in Figure 1.

Referring to the drawing, in which like reference characters identify like parts, in Figures 1 and 2 a printed circuit component generally indicated at 10 includes a pair of plates 11 and 12 of ceramic material. Plate 11 has a coating 13 of conductive material, such as silver, printed on side A (see Figure 1) and a coating 14 of conductive material printed on the opposite side B (Figure 2) to form the plates of a capacitor. In addition a strip 15 of resistance material is printed on side B of plate 11 extending between the coating 14 and another coating 16 of conductive material. Strip 15 is thus a resistor in series with the capacitor comprising coatings 13 and 14. Plate 12 similarly has conductive coatings 17 and 18 printed respectively on its sides C (Figure 1) and D (Figure 2) to form a capacitor and a resistance strip 19 connects coating 17 to another conductive coating 20 on side C (Figures 1 and 2).

Figures 7, 8:
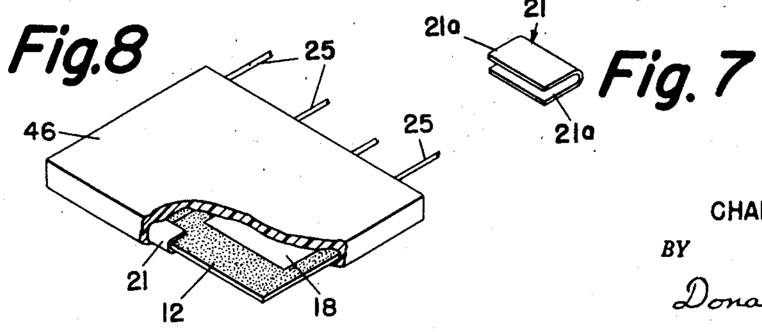
Figure 7 is a perspective view of a U-shaped clip used with the printed circuit components.
Figure 8 is a perspective view partially broken away of a printed circuit component made in accordance with this invention enclosed in a protective covering.

Plates 11 and 12 are placed in edgewise abutting relation and are connected by U-shaped clips 21 which extend across the junction of the abutting edges and grip a portion of each plate. The clips 21 are of a resilient material and have their legs 21*a* (Figure 7) normally spaced apart a distance less than the thickness of the ceramic plates. Thus when the clips 21 are forced onto the plates the legs 21*a* will tightly grip the plates therebetween to rigidly join the plates together in a single unit. By making the clips 21 of an electrically conductive material and extending the conductive coatings into contact with the clips the coatings on the plates may be electrically connected as shown in Figure 1.

If desired the clips 21 can be further secured to the plates by soldering them to either the conductive coatings such as at 22 (Figure 1) or to additional metal coatings 23 as at 24. Terminal wires 25 may be soldered to the various coatings to terminate the component. As shown, the conductive coatings 13, 14, 17 and 18 forming the plates of the capacitors on the plates 11 and 12 are all of substantially the same active area. However, the capacitors may be made having radically different values by making the plates 11 and 12 of materials having dielectric constants. Thus the capacitors, although of different values, are formed by coatings which are of the optimum area for easily printing to close tolerances and are joined to form a single printed circuit component. If desired the unit may then be coated with or molded into a protective covering 46 (see Figure 8) which will also help to hold the plates securely together.

Figure 3:
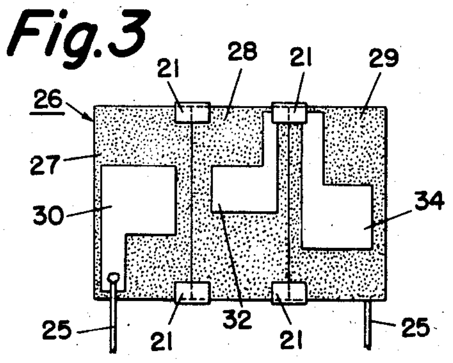
Figure 3 is a plan view of one side of another printed circuit component.
Figure 4:
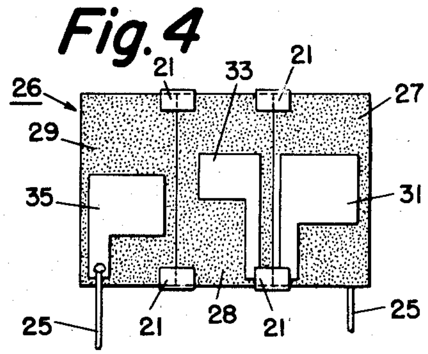
Figure 4 is a plan view of the other side of the component shown in Figure 3.

Referring to Figures 3 and 4 a printed circuit component generally indicated at 26 comprises three plates 27, 28 and 29 of ceramic material respectively having coatings 30 and 31, 32 and 33, and 34 and 35 of conductive material printed thereon to form a capacitor on each plate. The plates are connected together in edgewise abutting relation by U-shaped clips 21 some of which also connect the capacitors in series as shown in these figures. The plates 27, 28 and 29 are each of a material having the proper dielectric constant and temperature coefficient for the value of the capacitor printed thereon. Terminal wires 25 are soldered to the conductive coatings to terminate the component. If desired the component may likewise be provided with a protective covering.

Figure 5:
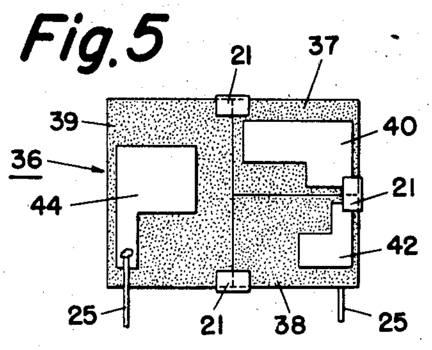
Figure 5 is a plan view of one side of still another printed circuit component.
Figure 6:
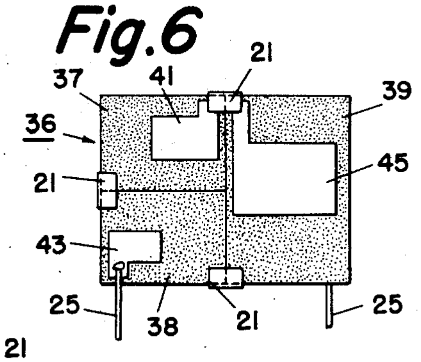
Figure 6 is a plan view of the other side of the component shown in Figure 5.

Turning now to Figures 5 and 6 another three plates comprising printed circuit component generally indicated at 36 includes the ceramic plates 37, 38 and 39 arranged in a different manner. Two of the plates 37 and 38 are in abutting edgewise relation with a second edge of each being in alignment. The aligned edges of the two plates 37 and 38 abut one edge of the third plate 39 and U-shaped clips 21 span the abutting edges and clamp the three plates into a single unit. The opposed sides of the plates 37, 38 and 39 are printed respectively with conductive coatings 40 and 41, 42 and 43, and 44 and 45 to form capacitors on each plate. Further coatings 40 and 42 and 41 and 45 are connected by clips 21 and thus the capacitors are connected in series. Terminals 25 are soldered to coatings 43 and 44 to terminate the unit. Plates 37, 38 and 39 are each of a material to provide a proper dielectric constant and temperature coefficient for the value of the capacitor printed thereon. This unit may likewise be provided with a protective covering if desired.

Although units of three plates only are shown, any number of plates may be used to make up the desired completed component. Also units such as shown in Figures 3 to 6 may include resistors on each plate in the same manner as shown in Figures 1 and 2 or other types of electrical components such as a coil. More than one resistor and/or capacitor or other component may be printed on each plate of an assembly as long as each capacitor on each plate is of a proper value for the dielectric constant of the plate. Thus subassemblies of various plates having printed thereon resistors and capacitors and other components can be made up and joined both mechanically and electrically to form a printed circuit component having the desired circuit. The U-shaped clips can be used to electrically join components on opposite sides of the same plate or on opposite sides of adjacent plates as well as components on the same side of adjacent plates. Since each subassembly includes only a few components, each sub-assembly can be produced with a high production yield. The completed unit is then made up of only the good pre-tested sub-assemblies. Also as previously stated the cost of a number of small plates is less than that of a single plate having the combined area of the small plates. Thus a completed unit including a large number of components connected in any desired circuit can be easily made having a high production yield to provide a cheaper completed unit.

It will thus be seen that the objects set forth above, among those made apparent from the preceding description, are efficiently attained and, since certain changes may be made in the above constructions without departing from the scope of the invention, it is intended that all matter contained in the above description or shown in the accompanying drawings shall be interpreted as illustrative and not in a limiting sense.

It is also to be understood that the following claims are intended to cover all of the generic and specific features of the invention herein described, and all statements of the scope of the invention which, as a matter of language, might be said to fall therebetween.

Having described my invention, what I claim as new and desire to secure by Letters Patent is:

1. A multiple element printed circuit component comprising the combination of a plate of an electrical insulation material, a second plate of an electrical insulation material having an edge abutting an edge of said first named plate, a U-shaped clip of electrical conductive material extending across the juncture of the abutting edges of said plates and having its legs gripping only a small portion of each plate therebetween so as to hold said plates together and a coating printed on said plates to form electrical components, a portion of the printed coating on each plate contacting said clip so that the clip electrically connects the coatings on the plates.

2. A multiple element printed circuit component comprising the combination of a plurality of plates of a ceramic material in edgewise abutting relation, a plurality of U-shaped clips of electrically conductive material each extending across the junction of the abutting edges of two of said plates and having its legs gripping only a small portion of each of the abutting plates therebetween so as to hold said plates together in a single unit, and a coating printed on said plates to form electrical components, said printed coating extending into contact with said clips so as to electrically connect the coatings on the plates.

3. A multiple element printed circuit component comprising the combination of a thin polygonal plate of an electrical insulation material, a coating printed on the surfaces of said plate to form electrical components, a second thin polygonal plate of electrical insulation material, the material of said second plate having a dielectric constant different from that of said first plate, a coating printed on the surfaces of said second plate to form electrical components, said second plate having an edge abutting an edge of said first plate, the edges of said plates adjacent the abutting edges being substantially in alignment and a U-shape clip extending along each pair of aligned edges and across the junction of the abutting edges, each of said clips having its legs gripping only a small portion of each plate therebetween so as to hold said plates together, at least one of said U-shaped clips being of an electrically conductive material and contacting the coatings on each of said plates so as to also electrically connect the printed coatings.

References Cited in the file of this patent

UNITED STATES PATENTS

| | | |
|---|---|---|
| 1,612,952 | Stevenson | Jan. 4, 1927 |
| 2,196,147 | Dunn | Apr. 2, 1940 |
| 2,322,068 | Starie | June 15, 1943 |
| 2,474,988 | Sargrove | July 5, 1949 |
| 2,495,546 | Posen | Jan. 24, 1950 |
| 2,549,424 | Carlson | Apr. 17, 1951 |
| 2,566,666 | Khouri | Sept. 4, 1951 |
| 2,583,586 | Miller | June 29, 1952 |
| 2,613,252 | Heibel | Oct. 7, 1952 |
| 2,648,804 | Steigerwalt | Aug. 11, 1953 |
| 2,673,949 | Khouri | Mar. 30, 1954 |
| 2,680,219 | Gould | June 1, 1954 |